(12) United States Patent
Peng et al.

(10) Patent No.: US 11,062,886 B2
(45) Date of Patent: Jul. 13, 2021

(54) APPARATUS AND METHOD FOR CONTROLLING WAFER UNIFORMITY

(71) Applicant: Taiwan Semiconductor Manufacturing Co., Ltd., Hsinchu (TW)

(72) Inventors: Hsiao-Hua Peng, Hsinchu (TW); Hann-Ru Chen, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 496 days.

(21) Appl. No.: 15/904,053

(22) Filed: Feb. 23, 2018

(65) Prior Publication Data

US 2019/0164730 A1    May 30, 2019

Related U.S. Application Data

(60) Provisional application No. 62/591,310, filed on Nov. 28, 2017.

(51) Int. Cl.
| | |
|---|---|
| *H01J 37/32* | (2006.01) |
| *H01L 21/66* | (2006.01) |
| *H01L 21/67* | (2006.01) |
| *C23C 16/46* | (2006.01) |

(52) U.S. Cl.
CPC ........ *H01J 37/32724* (2013.01); *C23C 16/46* (2013.01); *H01J 37/32798* (2013.01); *H01L 21/67103* (2013.01); *H01L 21/67248* (2013.01); *H01L 22/20* (2013.01); *H01L 22/26* (2013.01); *H01L 22/12* (2013.01)

(58) Field of Classification Search
CPC ................................................. H01J 37/32724
See application file for complete search history.

(56) References Cited

U.S. PATENT DOCUMENTS

| | | | |
|---|---|---|---|
| 7,161,121 B1* | 1/2007 | Steger | H01L 21/67109 118/725 |
| 8,216,486 B2* | 7/2012 | Dhindsa | C23C 16/4557 118/715 |
| 8,963,052 B2* | 2/2015 | Benjamin | H01L 21/67069 219/444.1 |
| 9,420,639 B2* | 8/2016 | Sun | H01J 37/32522 |
| 10,431,435 B2* | 10/2019 | Lubomirsky | H01L 21/68785 |

(Continued)

*Primary Examiner* — David P Angwin
*Assistant Examiner* — Nicholas A Ros
(74) *Attorney, Agent, or Firm* — Duane Morris LLP

(57) ABSTRACT

An apparatus for controlling wafer uniformity is disclosed. In one example, the apparatus includes: a plurality of temperature control elements and a processor. Each of the temperature control elements corresponds to a different portion of a wafer respectively such that the temperature control elements correspond to different portions of the wafer. Each of the temperature control elements is configured to individually control temperature of a corresponding portion of the wafer. The processor determines at least one portion of the wafer for temperature uniformity control, and instruct at least one of the temperature control elements, corresponding to the at least one portion, to adjust temperature of the at least one portion for controlling temperature uniformity of the wafer.

18 Claims, 12 Drawing Sheets
(6 of 12 Drawing Sheet(s) Filed in Color)

(56) References Cited

U.S. PATENT DOCUMENTS

2011/0092072 A1* 4/2011 Singh ...................... H05B 3/00
  438/710
2016/0345384 A1* 11/2016 Zhang ..................... H01L 22/20
2020/0051789 A1* 2/2020 Linebarger, Jr. ......... G01K 7/16

* cited by examiner

APPARATUS AND METHOD FOR CONTROLLING WAFER UNIFORMITY

CROSS-REFERENCE TO RELATED APPLICATION

The present application claims priority to U.S. Provisional Patent Application No. 62/591,310, filed on Nov. 28, 2017, which is incorporated by reference herein in its entirety.

BACKGROUND

Plasma enhanced processing techniques have gained widespread use in fabrication of devices for various applications, such as semiconductor integrated devices, microelectronic devices, and microelectromechanical device. Although feature sizes in these applications can vary from sub-micrometers to a few nanometers, advanced technologies for in-line processing control are required during fabrication to monitor the within wafer and/or batch-to-batch critical dimension (CD) uniformity to provide maximum production yields. For example, in the manufacturing of integrated circuits, patterning techniques such as photolithography, deposition, and etching are used to form various features. Ideally, the etch rate (ER) of a set of identical wafers from an etching processing station should be constant and predictable. However, the etch process exhibits process drift and unpredictable shifts in behavior due to effects, such as, for example incoming wafer variability, chamber maintenance activities, chamber conditioning, etc. Because of these process drifts, critical dimensions of the patterned features may not be uniform within a device die and/or a wafer. Thus, inconsistent ER could result in out-of-specification etching. Large across-wafer out-of-specification critical dimensions eventually cause large die-to-die performance variations and thus low production yields.

A key factor for wafer uniformity during a plasma enhanced processing, e.g. etching, deposition, or polishing, is the temperature uniformity on the wafer surface. An existing heater, e.g. a chuck heater, for plasma enhanced processing heats a wafer by different zones, e.g. heating an edge zone of the wafer by an outer annular capacitor, and heating a center zone of the wafer by an inner annular capacitor located radially inside of the outer annular capacitor. This kind of heater can induce center-edge difference on wafer temperature, and hence center-edge difference on plasma density, chemical reaction rate, etch rate, deposition rate, polish rate, etc. As such, based on current hardware design of a heater, it is hard to control wafer uniformity during plasma enhanced processing, and the wafer surface temperature is only tunable by zone. Therefore, existing heating apparatus and methods for achieving wafer uniformity are not entirely satisfactory.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
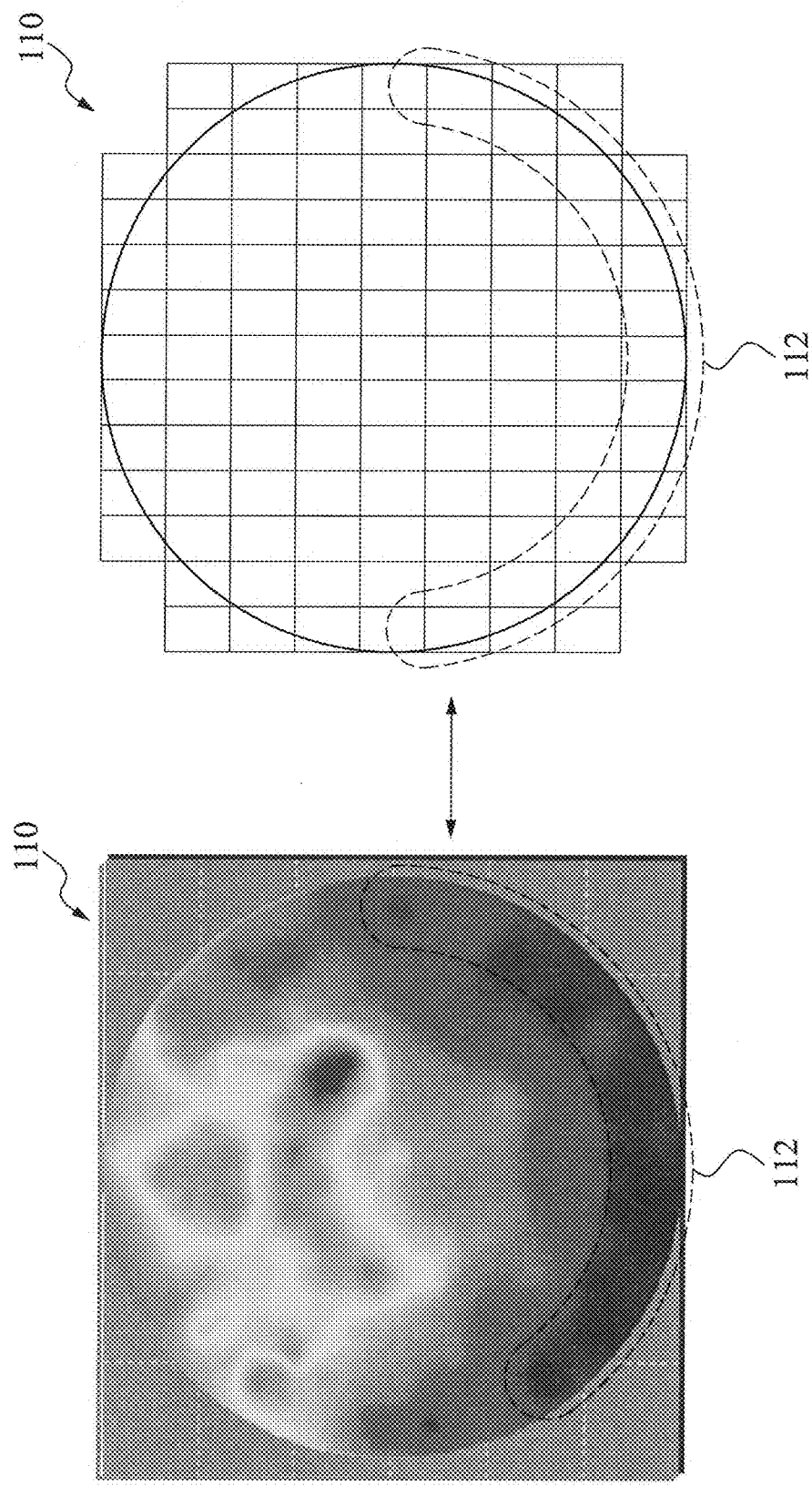
FIG. 1 illustrates a correlation between an exemplary inline map and a corresponding yield map of a wafer, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

In-line wafer uniformity control is a tough task for all stages in plasma enhanced processing. For example, critical dimension (CD) performance in polysilicon etch process is hard to control but is critical to final wafer testing, e.g. wafer acceptance test (WAT) or circuit probe (Cp), which can easily suffer a loop edge or a low yield. A key factor for wafer uniformity during a plasma enhanced processing is the temperature uniformity on the wafer surface. An existing heater, e.g. a chuck heater, for plasma enhanced processing heats a wafer by different zones, e.g. heating an edge zone of the wafer by an outer annular capacitor, and heating a center zone of the wafer by an inner annular capacitor located radially inside of the outer annular capacitor. This kind of heater can induce center-edge difference on wafer temperature, and hence center-edge difference on plasma density, chemical reaction rate, etch rate, deposition rate, polish rate, etc. As such, based on current hardware design of a heater, it is hard to control wafer uniformity during plasma enhanced processing, and the wafer surface temperature is only tunable by zone.

The present disclosure provides various embodiments of a novel apparatus and method for controlling wafer uniformity during plasma enhanced processing. Specifically, the present disclosure provides a new heating apparatus that includes a plurality of temperature control elements each of which is configured to individually control temperature of a respective portion of a wafer. Each respective portion of the wafer may be referred to as a site. Different sites corresponding to the temperature control elements may have a same size. In one embodiment, the different sites are evenly distributed on the wafer. In another embodiment, at least one of the different sites has a shape different from an annulus.

The present disclosure is applicable to wafer uniformity control during any wafer processing involved with temperature adjustment, e.g. a plasma enhanced processing with heating operations. The disclosed apparatus can improve the wafer uniformity during the wafer processing by performing a per-site temperature tuning on the wafer. In the present disclosure, the terms "site," "wafer site," and "wafer portion" may be interchangeably used.

In one embodiment, the disclosed apparatus further includes a processor configured to determine at least one portion or site of the wafer for uniformity control, and instruct at least one of the temperature control elements, corresponding to the at least one portion, to adjust temperature of the at least one portion for controlling uniformity of the wafer. As such, the disclosed apparatus enables the wafer surface temperature to be tunable by site and solves the issue of center-edge difference on wafer temperature and corresponding critical dimension (CD) performance, thus improving wafer uniformity during plasma enhanced processing.

During temperature tuning, the apparatus may either adjust temperature of each site separately or adjust temperatures of a group of sites on the wafer together. For example, the apparatus can group together worst wafer sites in terms of contributions to wafer non-uniformity, and perform temperature tuning on the group to improve wafer uniformity. The worst wafer sites in the group may or may not be connected to each other on the wafer.

Each temperature control element can control temperature of a corresponding portion or site of the wafer by utilizing at least one of: a laser, an ultraviolet, an infrared, and a microwave. In one embodiment, each temperature control element includes a heating element configured to increase temperature of the corresponding portion of the wafer; a cooling element configured to decrease temperature of the corresponding portion of the wafer; and a sensing element configured to detect temperature of the corresponding portion of the wafer. The temperature control element may be located either above or under the wafer during the uniformity control, e.g. in a wafer process chamber.

FIG. 1 illustrates a correlation between an exemplary inline map 110 and a corresponding yield map 120 of a wafer, in accordance with some embodiments of the present disclosure. As shown in FIG. 1, the inline map 110 shows a distribution of CD performance on a wafer; while the yield map 120 shows a distribution of low yield parts on the wafer. The non-uniformity of the CD performance distribution in the inline map 110 corresponds to the non-uniformity of the low yield distribution in the yield map 120. For example, the outlier region 112 that may be a thinner or cooler region than the other regions in the inline map 110, corresponds to the outlier region 122 that is a lower yield region than the other regions in the yield map 120. As such, a wafer non-uniformity does impact the production yields, and improving the wafer uniformity will improve the production yield as well.

Figure 2:
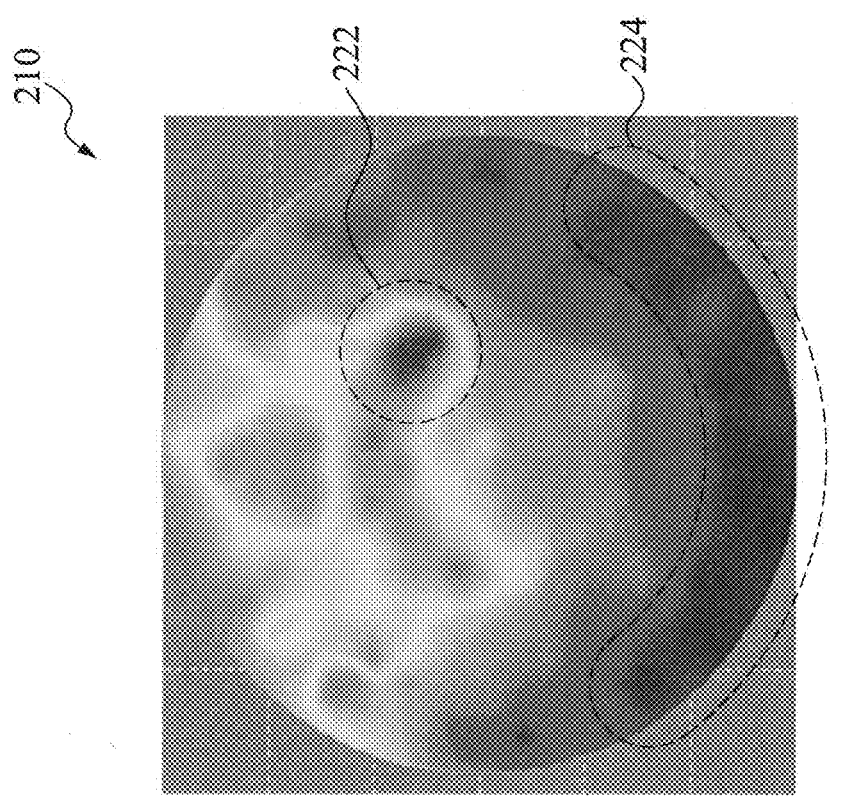
FIG. 2 illustrates exemplary critical dimension (CD) maps of a wafer both after-development inspection (ADI) and after-etch inspection (AEI), in accordance with some embodiments of the present disclosure.
Figure 2:
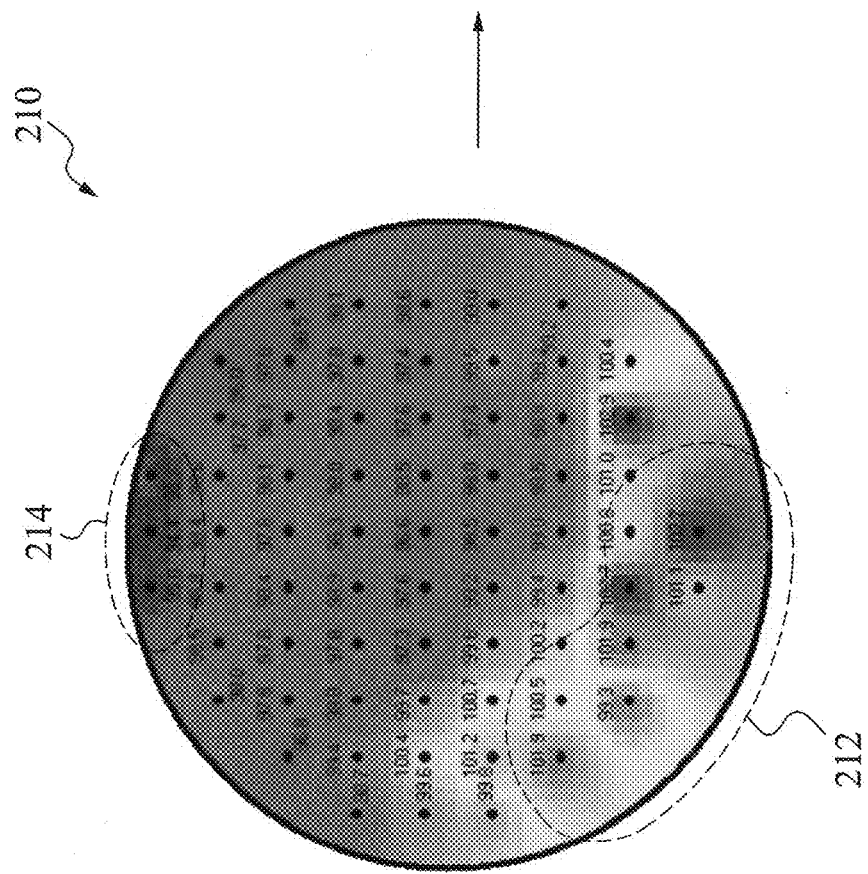

FIG. 2 illustrates exemplary CD maps of a wafer both after-development inspection (ADI) and after-etch inspection (AEI), in accordance with some embodiments of the present disclosure. A polysilicon (POLY) ADI CD map 210 shows critical dimensions of features on a wafer after development using a photolithography process. Similarly, a POLY AEI CD map 220 shows critical dimensions of features on the wafer after an etching process. As shown in FIG. 2, both the POLY ADI CD map 210 and the POLY AEI CD map 220 include outlier regions 212, 214, 222, 224 that contribute to wafer non-uniformity after development and after an etching process, respectively.

Figure 3:
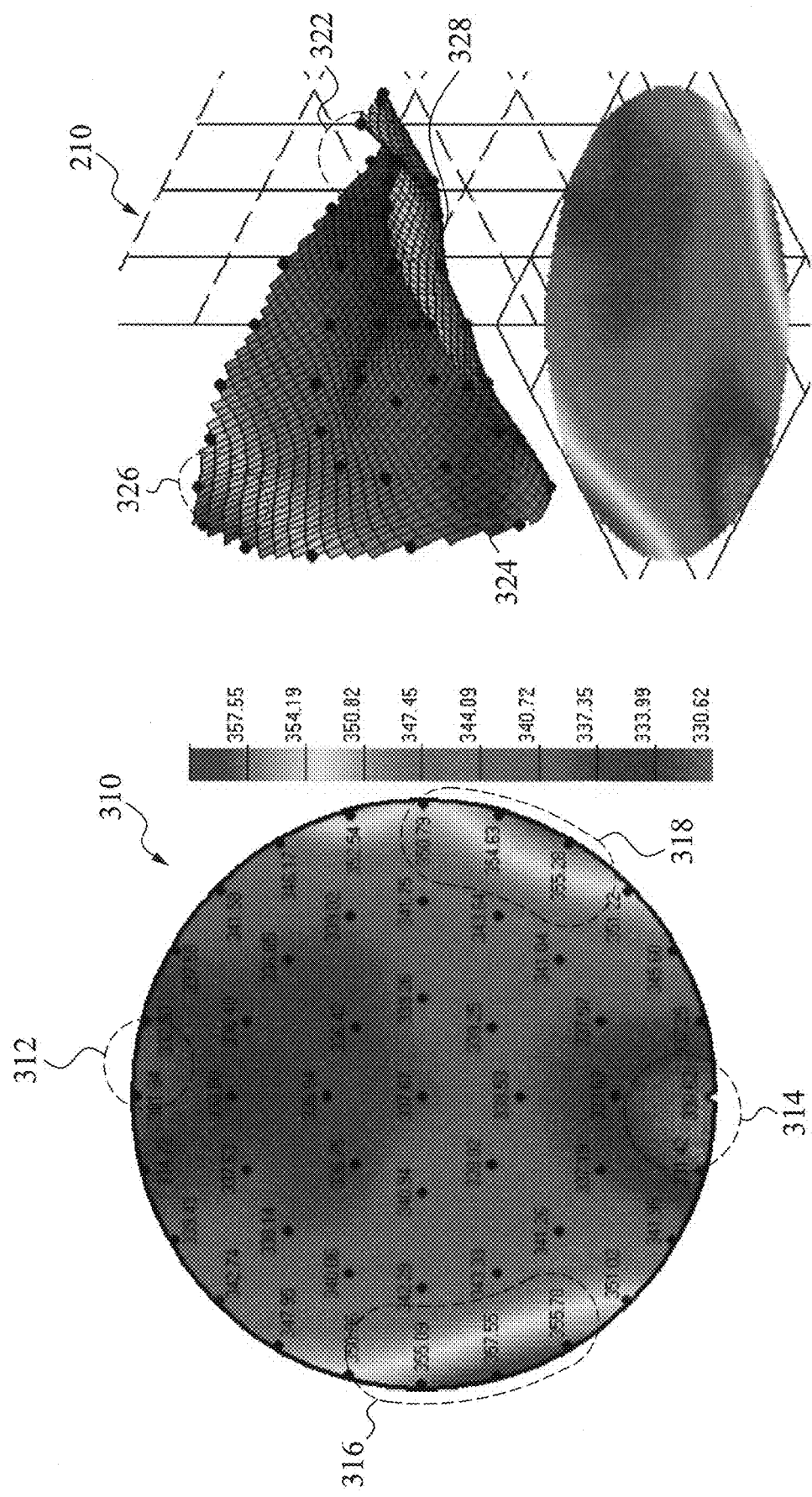
FIG. 3 illustrates an exemplary thickness map of a wafer after chemical vapor deposition (CVD), in accordance with some embodiments of the present disclosure.

FIG. 3 illustrates an exemplary thickness map of a wafer after chemical vapor deposition (CVD), in accordance with some embodiments of the present disclosure. FIG. 3 includes both a two-dimensional thickness map 310 and a corresponding three-dimensional thickness map 320. In a thickness map, an outlier region can be either a region too thick compared to the average thickness of the wafer, e.g. the regions 316, 318, 326, 328, or a region too thin compared to the average thickness of the wafer, e.g. the regions 312, 314, 322, 324. An outlier region may include one or more wafer sites of the wafer.

Figure 4:
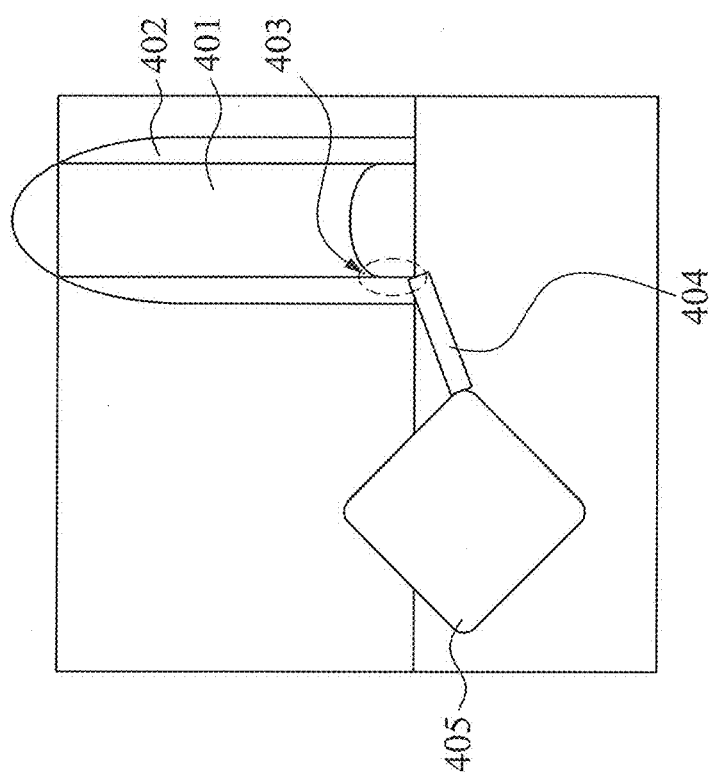
FIG. 4 illustrates an exemplary etch damage induced by a thin edge on a manufactured good (MG) of a wafer, in accordance with some embodiments of the present disclosure.

FIG. 4 illustrates an exemplary etch damage induced by a thin edge on a manufactured good (MG) of a wafer, in accordance with some embodiments of the present disclosure. As shown in FIG. 4, when the edge layer 402 of a MG 401 is very thin, an etch damage condition 403 may result, causing a leak path 404 from the MG 401 to a side active area 405, which may eventually cause a failure of the MG part on the wafer and a low part yield on the wafer.

Figure 5A:
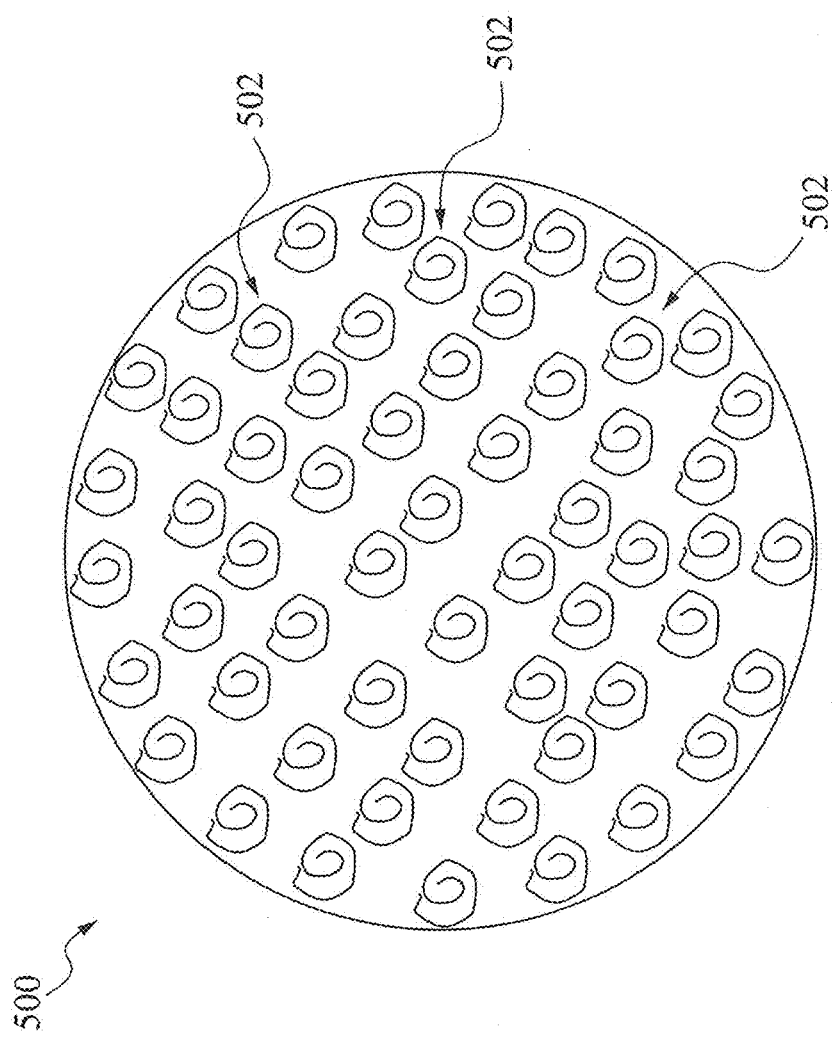
FIG. 5A illustrates an exemplary heating apparatus, in accordance with some embodiments of the present disclosure.

FIG. 5A illustrates an exemplary heating apparatus 500, in accordance with some embodiments of the present disclosure. For purpose of illustration in FIG. 5A, the heating apparatus 500 includes a plurality of electromagnetic coils 502 evenly distributed thereon. Although not perfectly reflected in FIG. 5A, one skilled in the art can understand that the tem "even" or "evenly" herein may refer to a uniform distribution of the electromagnetic coils with a constant density in a given area. In one embodiment, the electromagnetic coils may have a same size and distributed in a grid or matrix array having perpendicular rows and columns. In another embodiment, the electromagnetic coils may have a same size and distributed in radial or spiral pattern.

The heating apparatus 500 has a same shape as a wafer, such that each electromagnetic coil distributed on the heating apparatus 500 corresponds to a respective portion or site on a wafer. Each electromagnetic coil may be a temperature control element 510 that can individually control temperature of the corresponding site on the wafer. In one embodiment, different sites corresponding to the temperature control elements have a same size. In one embodiment, the different sites are evenly distributed on the wafer. In another embodiment, at least one of the different sites has a shape different from an annulus.

Figure 5B:
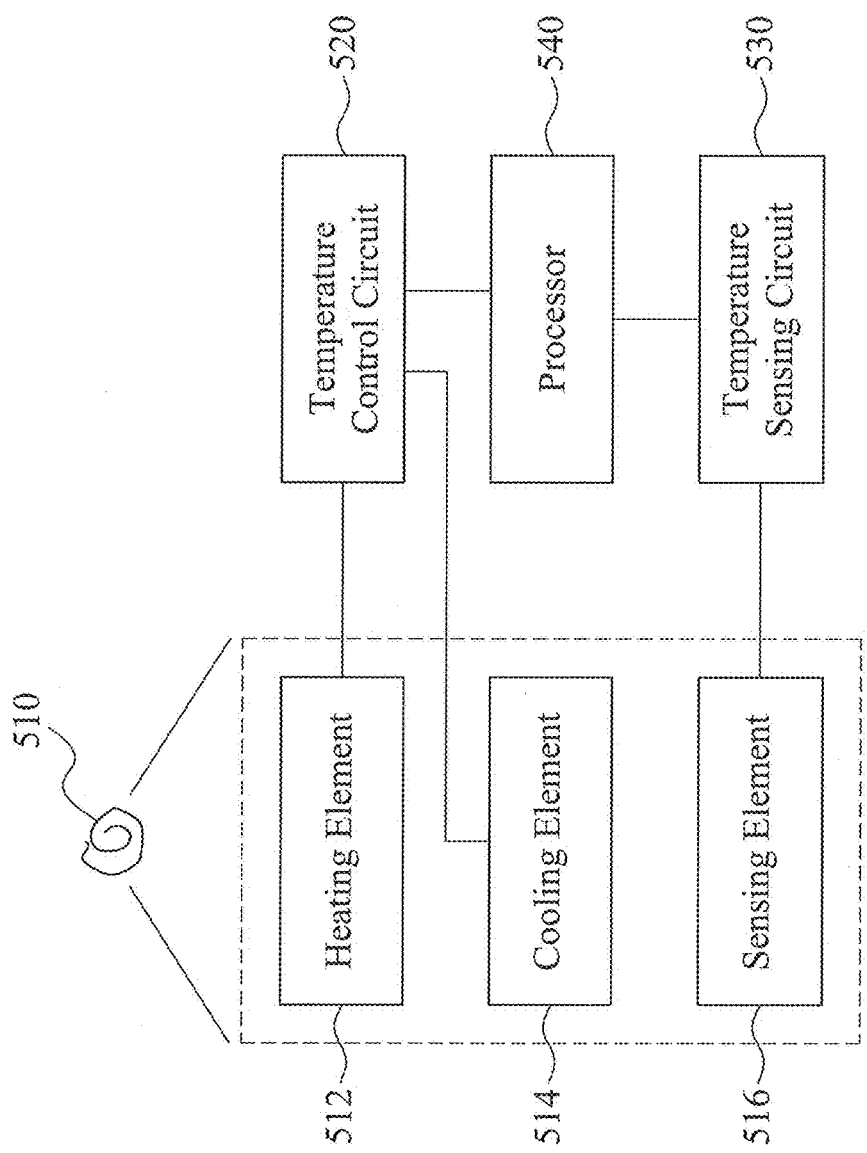
FIG. 5B illustrates a diagram of an exemplary heating apparatus, in accordance with some embodiments of the present disclosure.

FIG. 5B illustrates a diagram of an exemplary heating apparatus, in accordance with some embodiments of the present disclosure. As shown in FIG. 5B, each temperature control element 510 includes a heating element 512, a cooling element 514, and a sensing element 516 that can be individually controlled and can work together to provide a temperature map across the surface of the wafer. In one embodiment, the heating apparatus 500 further comprises a temperature control circuit 520, a temperature sensing circuit 530, and a processor 540. In other embodiments, one or more of the temperature control circuit 520, the temperature sensing circuit 530, and the processor 540 are located in a remote computer or server that can communicate with the heating apparatus 500.

The temperature control circuit 520 serves to apply control signals to the heating elements 512 and the cooling elements 514 in one or more temperature control elements 510, responsive to a temperature map provided by the processor 540 and measured temperature feedback from the sensing element 516 and the temperature sensing circuit 530.

The heating element 512 in the temperature control element 510 can be Peltier devices and/or resistive heaters such as polyimide heaters, silicone rubber heaters, mica heaters, metal heaters (e.g. W, Ni/Cr alloy, Mo or Ta), ceramic heaters (e.g. WC), semiconductor heaters, carbon heaters, or any other suitable type of heating element as desired. The heating element 512 in the temperature control element 510 can be implemented in various designs or configurations, such as being screen printed, wire wound, etched foil heaters, or any other suitable design as desired.

Temperature control is further provided by cooling the wafer with the cooling element 514 through the temperature control circuit 520. In some embodiments, the liquid or gaseous coolant passing through the cooling element 514 can be chilled with an external chiller (not shown) for greater cooling effect, and can be recirculated for greater efficiency. The external chiller cooling and recirculating a coolant fluid can be controlled by the temperature control circuit 520. Faster cooling rate is possible if a chiller is used to cool the coolant fluid to a temperature below atmospheric, in accordance with some embodiments. In some embodiments, the cooling element 514 may not be necessary in the temperature control element 510. In some embodiments, one cooling element 514 can be shared by at least two neighbor temperature control elements 510. In some embodiments, the cooling element 514 can be cryogenic.

Local temperature of the wafer is detected by the sensing element 516 through a temperature sensing circuit 530 and can be used as a feedback to the heating element 512 and the cooling element 514. This is particularly useful in regulating the temperature of the wafer with a desired time response. In some embodiments, different types of sensing elements can be implemented, including contact and non-contact temperature sensors depending on the desired performance, e.g., detection range, sensitivity, accuracy, response time, repeatability, size, power consumption, cost, etc. In accordance with various embodiments, a contact type temperature sensor can be a thermostat consisting of two different metals (e.g., nickel, copper, tungsten, aluminum, etc.), a thermistor typically consisting of ceramic materials (e.g., oxides of nickel, manganese, cobalt, etc.), a thin film resistive sensor typically consisting of thin high-purity conducting metals (e.g., platinum, copper, nickel, etc.), a thermocouple consisting of two different metals (e.g., copper, iron, a variety of metal alloys, etc.) and two junctions, a semiconductor junction sensor, an infra-red radiation sensor, and the like. In some embodiments, the heating elements can also function as temperature sensing elements.

Temperature values at positions of each of the plurality of temperature control elements 510 is controlled by the power to the heating element 512, the temperature/flow rate of cooling fluid flowing through the fluid conduit of the cooling element 514, and the feedback from the sensing element 516, in accordance with various embodiments. Additional circuits or algorithm may be needed to provide an accurate heating and cooling time response, e.g., time to reach a steady-state. Accordingly, a temperature map or a plasma distribution map can be configured by the plurality of temperature control elements 510 for processing a wafer.

In some embodiments, the temperature control circuit 520 comprises a power supply, a coolant supply and a control circuit for each of the plurality of temperature control elements 510. In some embodiments, the temperature control circuit 520 may comprise a multiplexing control unit to regulate a plurality of heating elements 512, cooling elements 514, and sensing elements 516 with a central control circuit, which eliminates the use of individual power supplies and a control circuit for each of the plurality of temperature control elements 510. In some embodiments, a switch circuit can be used together with amplifiers, A/D converters, etc. in the multiplexing control unit. In some embodiments, the temperature control circuit 520 is a representative device and may comprise a processor, a memory, an input/output interface, a communications interface, and a system bus. The processor may comprise any processing circuitry operative to control the operations and performance of the temperature control circuit 520 of the system 300.

In one embodiment, as shown in FIG. 5B, the processor 540 may be separate from the temperature control circuit 520 and is shared by the temperature sensing circuit 530. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth. In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory. In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuit 520.

In some embodiments, the I/O interface may comprise any suitable mechanism or component to at least enable a user to provide input to the control circuit 520 and the control circuit 520 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen). In some embodiments, the I/O interface may comprise a visual peripheral output device for providing a display visible to the user. For example, the visual peripheral output device may comprise a screen such as, for example, a Liquid Crystal Display (LCD) screen, incorporated into the control circuit 520.

In some embodiments, the communications interface may comprise any suitable hardware, software, or combination of hardware and software that is capable of coupling the control circuit 520 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

After generating a CD map, the processor 540 can determine at least one portion of the wafer for uniformity control, and instruct at least one of the temperature control elements 510, corresponding to the at least one portion, to adjust temperature of the at least one portion for controlling uniformity of the wafer. For example, the temperature of the at least one site is adjusted to minimize a non-uniformity in the CD map of the wafer, by minimizing at least one of: a plasma density variation among the different portions of the wafer, a chemical reaction rate variation among the different portions of the wafer, and a CD performance difference between center and edge of the wafer. The CD map represents CD performance of the wafer in at least one of the following plasma enhanced processes: etching, deposition, and polishing. For example, after development using a photolithography process on a wafer, a wafer site that has an ADI-CD value smaller than the average value may require a higher etch rate and thus a higher temperature. Similarly, a wafer site that have an ADI-CD value greater than the average value may require a smaller etch rate thus a lower temperature. After tuning the temperatures of the sites accordingly, a uniformity of CD values on the wafer surface after etching can be realized.

Besides temperature, the etching rate is also a function of chamber pressure and pressure distribution (uniformity). For example, at high pressure the etch rate may drop due to the increased scattering collisions of ions traversing the Faraday dark space, thus can increase angular spread in incident ions to the wafer, which cause increase of undercut and thus lateral etch. Other parameters that can affect the etching rate besides temperature and pressure include, gas flow rate, plasma power, cleanness, exposed material for etching, etc. Therefore, a temperature map according to an ADI-CD map may be determined based on particular plasma processing conditions, e.g., pressure and its distribution, plasma power and its distribution, flow rate, cleanness of the reaction chamber, temperature history (ramping profile), etc. In some embodiments, the plasma processing conditions are predefined and the processor 540 can therefore determine the plurality of temperature values and thus the temperature map. In some embodiments, the plasma processing conditions are not predefined and the processor 540 may perform a multiple-parameter optimization to search for an optimum combination of temperature, pressure as well as other plasma processing conditions that can minimize the non-uniformity on the wafer after the plasma processing. It can be understood that, the temperature tuning disclosed herein may include adjusting any of the above mentioned plasma processing conditions to adjust temperature and hence CD performance of the wafer sites on the wafer.

During temperature tuning, the apparatus 500 may either adjust temperature of each site separately or adjust temperatures of a group of sites on the wafer together. For example, the apparatus 500 can group together worst wafer sites in terms of contributions to wafer non-uniformity, and perform temperature tuning on the group to improve wafer uniformity. The worst wafer sites in the group may or may not be connected to each other on the wafer. Each temperature control element 510 can control temperature of a corresponding portion or site of the wafer by utilizing at least one of: a laser, an ultraviolet, an infrared, and a microwave.

Figure 6:
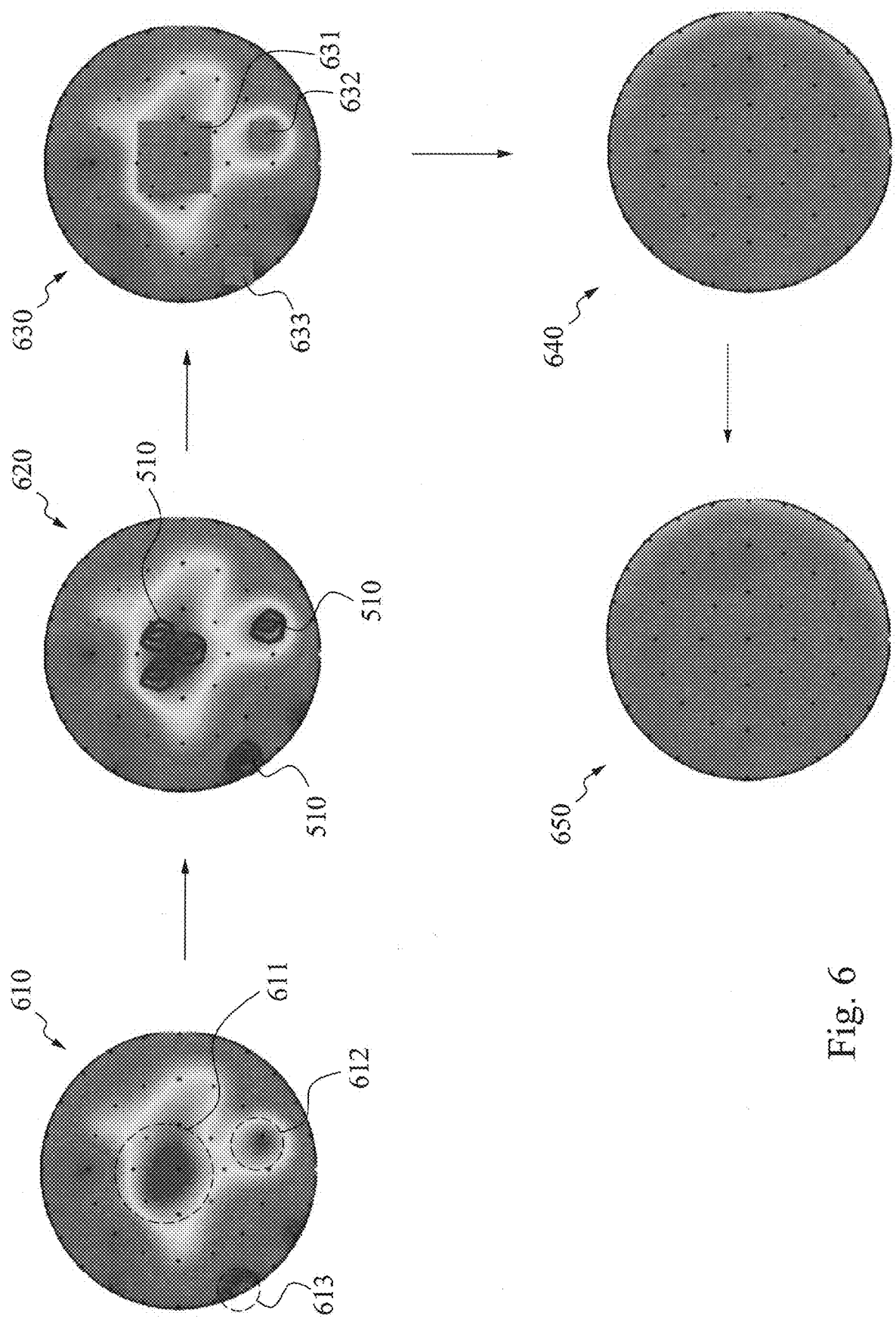
FIG. 6 illustrates an exemplary process for wafer uniformity control, in accordance with some embodiments of the present disclosure.

FIG. 6 illustrates an exemplary process for wafer uniformity control, in accordance with some embodiments of the present disclosure. As shown in FIG. 6, at stage 610, a non-uniform CD map is generated to represent a non-uniform distribution or CD performance on a wafer. In one example, the non-uniform CD map be generated inline during a fabrication process, such that the entire process illustrated in FIG. 6 is about a wafer uniformity control based on an inline adjustment of plasma densities and inline wafer temperature tuning. Several regions 611, 612, 613 on the wafer show outlier CD performances that contribute to the non-uniformity of the CD map. At stage 620, plasma power control is performed using per-site capacitors, e.g. the per-site electromagnetic coils 502 in FIG. 5A, It is understood that other plasma processing conditions in relation to the temperature can also be adjusted. Specifically, three groups of temperature control elements 510, each corresponding to one of the three outlier regions 611, 612, 613, are instructed to perform temperature tuning based on plasma power control to decrease or minimize the wafer non-uniformity.

Then at stage 630, the temperatures of the three outlier regions 611, 612, 613 are increased or decreased to make their temperatures closer to the average temperature of the wafer. Correspondingly, the plasma densities at the three outlier regions 611, 612, 613 are also adjusted to improve wafer uniformity. This temperature tuning may be performed during subsequent plasma processing of the same wafer or during the same plasma processing of the next wafer. At stage 640, a uniform plasma distribution is achieved. Then at stage 650, a corresponding uniform CD distribution is also achieved.

Figure 7:
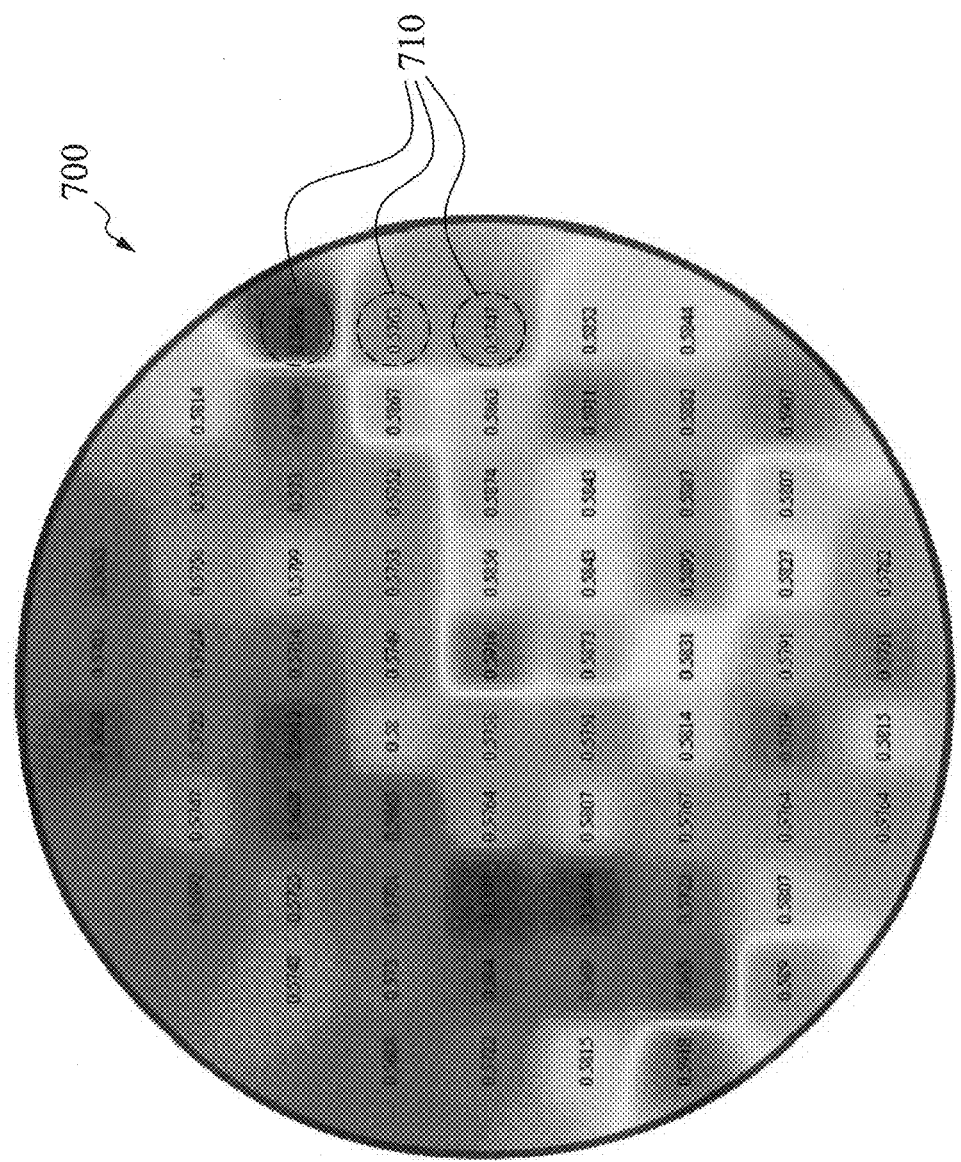
FIG. 7 illustrates an exemplary inline special map of a wafer, in accordance with some embodiments of the present disclosure.

FIG. 7 illustrates an exemplary inline special map 700 of a wafer, in accordance with some embodiments of the present disclosure. As shown in FIG. 7, certain wafer sites 710 have CD performances that deviate a lot from the average CD performance of the wafer, either being too large or too small.

Figure 8:
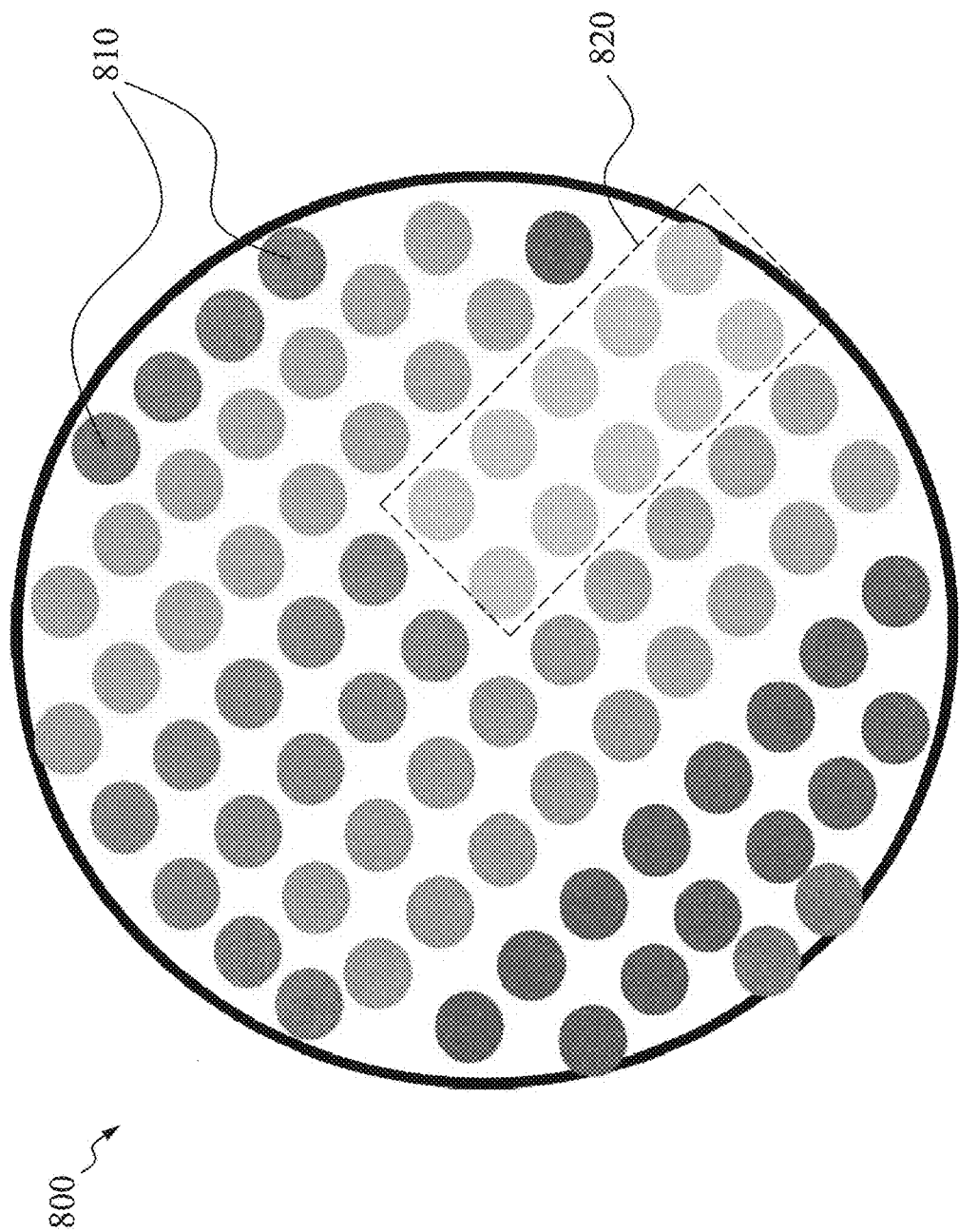
FIG. 8 illustrates an exemplary heating apparatus having a plurality of temperature control elements corresponding to different portions of a wafer, in accordance with some embodiments of the present disclosure.

FIG. 8 illustrates an exemplary heating apparatus 800 having a plurality of temperature control elements 810 corresponding to different portions of a wafer, in accordance with some embodiments of the present disclosure. As shown in FIG. 8, one or more temperature control elements 810 can form a group 820 during temperature tuning. For example, worst outlier wafer sites can be grouped together for temperature tuning. The temperature control elements corresponding to the outlier wafer sites in the group can perform a group temperature tuning to improve wafer uniformity. The outlier wafer sites in the group may or may not be physically connected to each other on the wafer.

Figure 9:
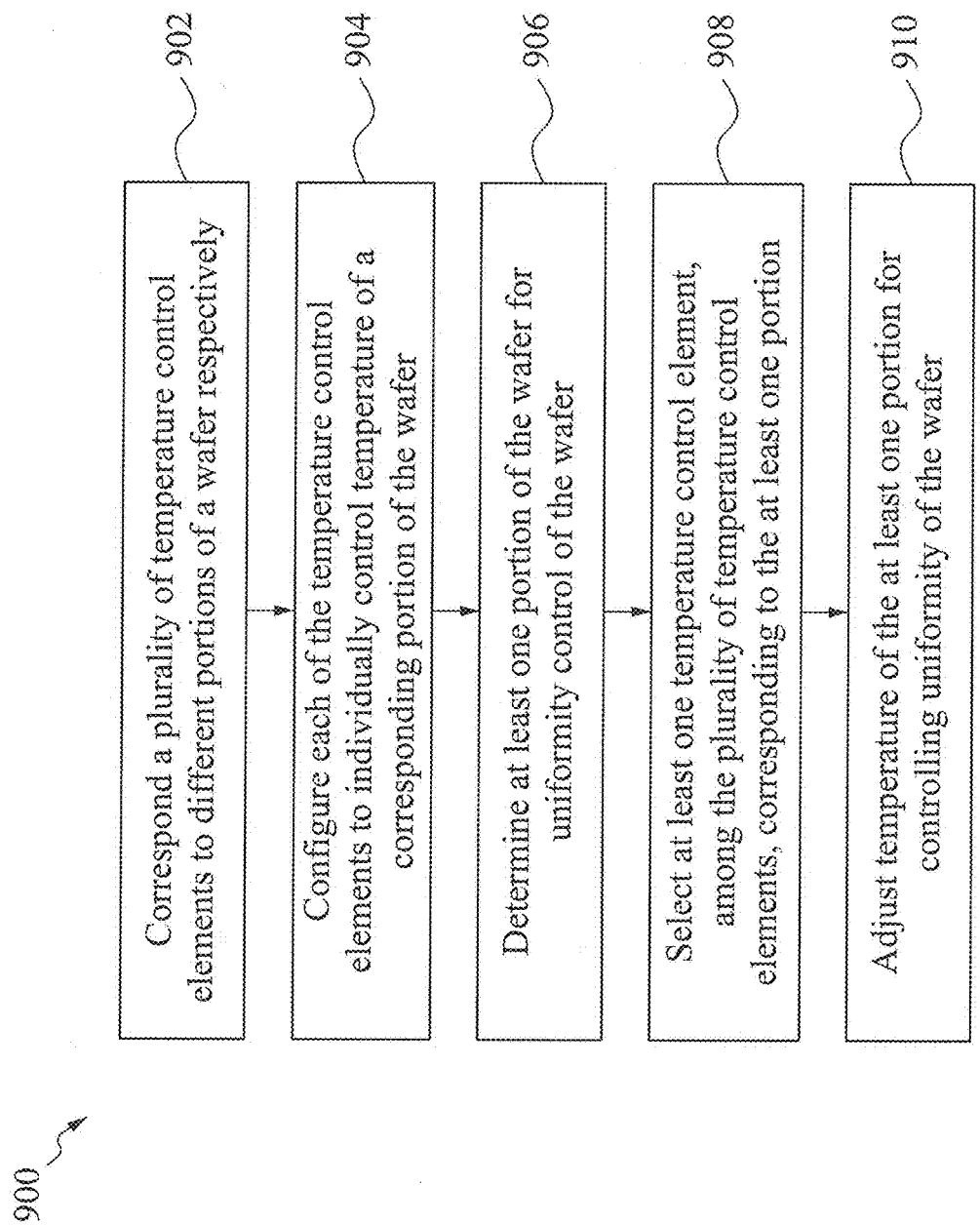
FIG. 9 is a flow chart illustrating an exemplary method for controlling wafer uniformity, in accordance with some embodiments of the present disclosure.

FIG. 9 is a flow chart illustrating an exemplary method 900 for controlling wafer uniformity, in accordance with some embodiments of the present disclosure. At operation 902, a plurality of temperature control elements is corresponded to different portions of a wafer respectively. Each of the temperature control elements is configured at operation 904 to individually control temperature of a corresponding portion of the wafer. At least one portion of the wafer is determined at operation 906 for uniformity control of the wafer. At least one temperature control element corresponding to the at least one portion is selected at operation 908, among the plurality of temperature control elements. At operation 910, temperature of the at least one portion is adjusted for controlling uniformity of the wafer. It is understood that the order of the operations shown in FIG. 9 may be changed according to different embodiments of the present disclosure.

Figure 10A:
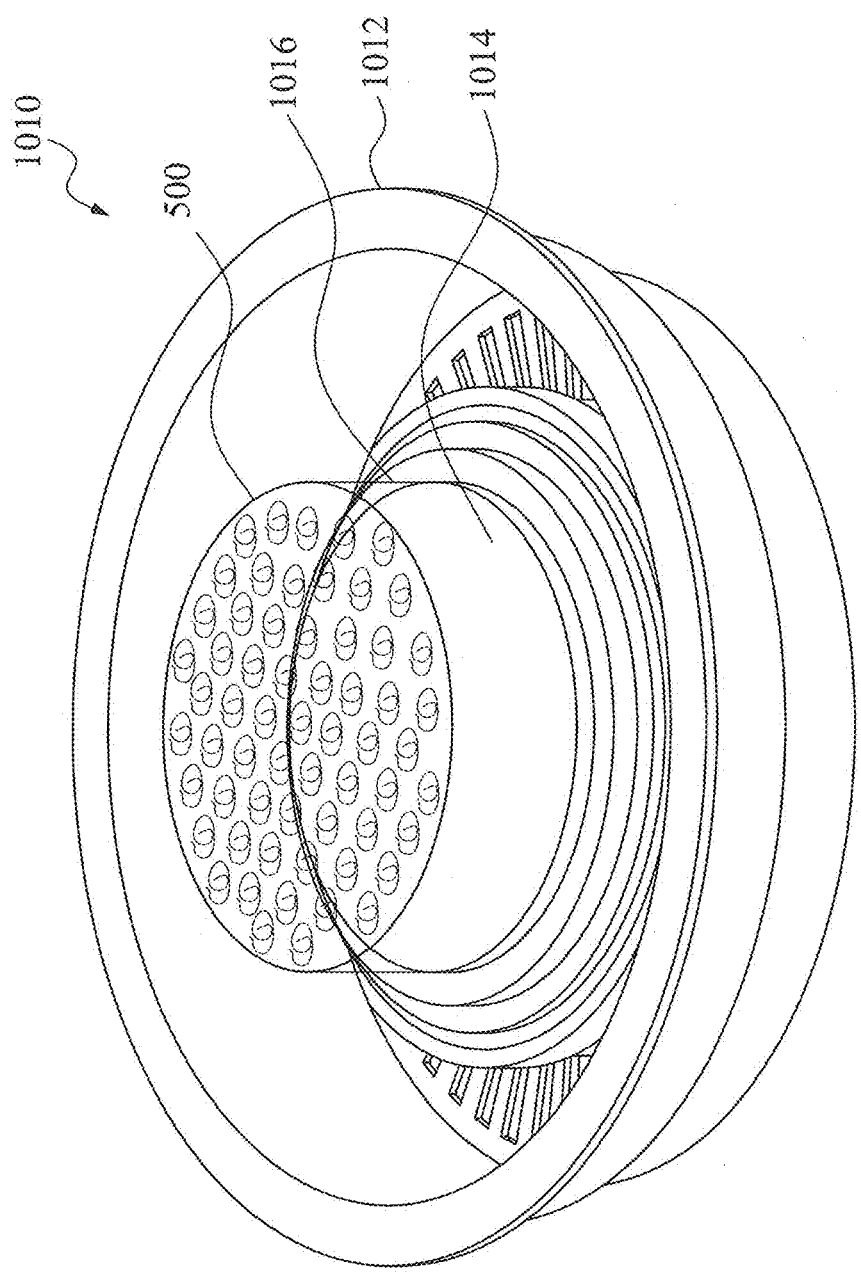
FIG. 10A illustrates an exemplary wafer process chamber including a heating apparatus for controlling wafer uniformity, in accordance with some embodiments of the present disclosure.

FIG. 10A illustrates an exemplary heating apparatus 500 for controlling wafer uniformity to be received in an interior 1010 of a wafer process chamber, in accordance with some embodiments of the present disclosure. As shown in FIG. 10A, in addition to the heating apparatus 500, the interior 1010 of the wafer process chamber in this example includes a housing 1012, a support 1014, and a connecting mechanism 1016. The support 1014 is inside the housing and configured to support a wafer (not shown) when the wafer is placed thereon and processed inside the housing 1012. The heating apparatus 500 including the plurality of temperature control elements in this example is above the wafer during the uniformity control, e.g. through a transformer-coupled plasma (TCP) window (not shown). The connecting mechanism 1016 can connect or support the heating apparatus 500 in the housing 1012. It can be understood that, while the connecting mechanism 1016 is vertically coupling the heating apparatus 500 to the support 1014 in FIG. 10A, other connecting mechanisms may be utilized in various embodiments of the present disclosure.

Figure 10B:
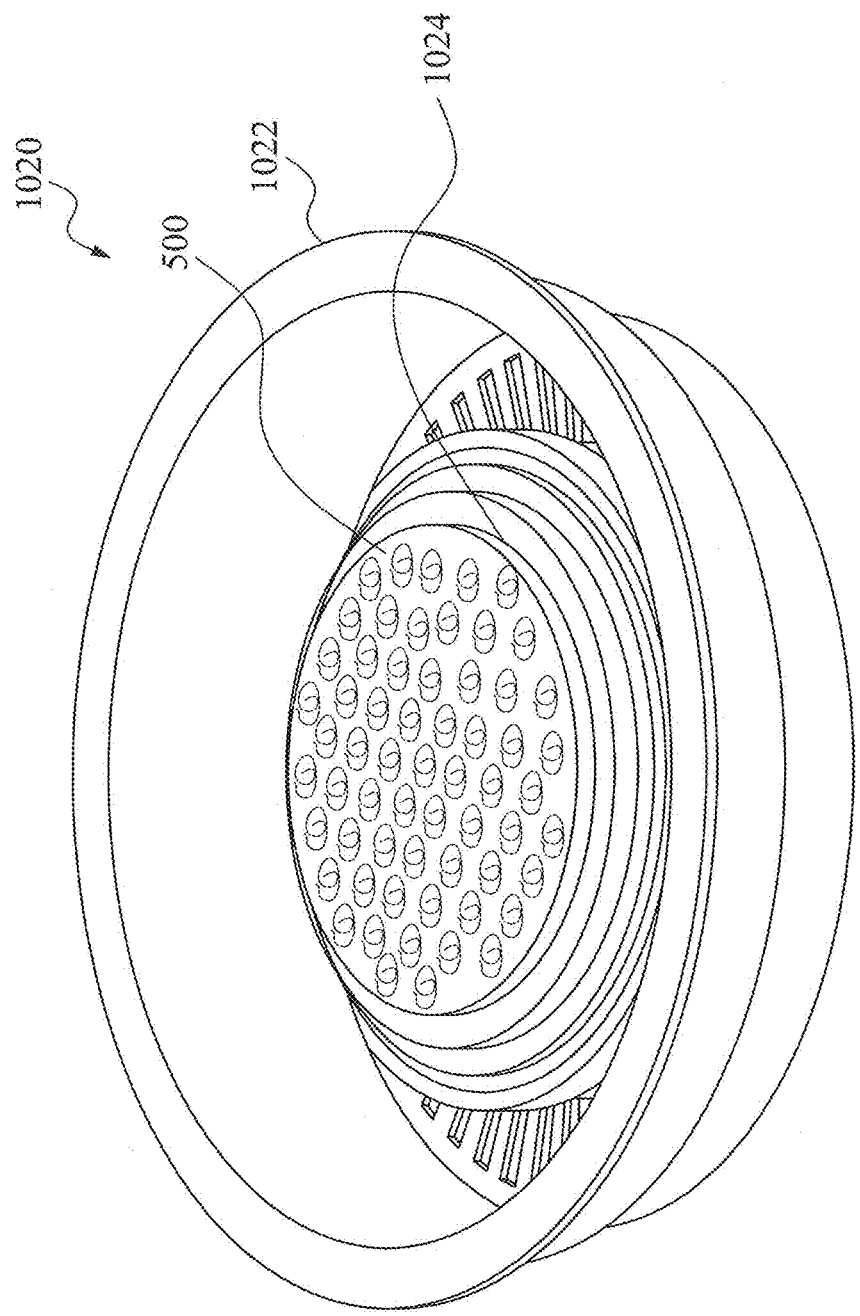
FIG. 10B illustrates another exemplary wafer process chamber including a heating apparatus for controlling wafer uniformity, in accordance with some embodiments of the present disclosure.

FIG. 10B illustrates another exemplary heating apparatus 500 for controlling wafer uniformity to be received in an interior 1020 of a wafer process chamber, in accordance with some embodiments of the present disclosure. As shown in FIG. 10B, in addition to the heating apparatus 500, the interior 1020 of the wafer process chamber in this example includes a housing 1022 and a support 1024. The support 1024 is inside the housing and configured to support a wafer (not shown) when the wafer is placed thereon and processed inside the housing 1022. The heating apparatus 500 including the plurality of temperature control elements in this example is coupled to the support 1024 and under the wafer during the uniformity control, e.g. through an e-chuck.

In an embodiment, an apparatus for controlling wafer uniformity is disclosed. The apparatus includes: a plurality of temperature control elements and a processor. Each of the temperature control elements corresponds to a different portion of a wafer respectively such that the temperature control elements correspond to different portions of the wafer. Each of the temperature control elements is configured to individually control temperature of a corresponding portion of the wafer. The processor determines at least one portion of the wafer for temperature uniformity control, and instruct at least one of the temperature control elements, corresponding to the at least one portion, to adjust temperature of the at least one portion for controlling temperature uniformity of the wafer.

In another embodiment, a wafer process chamber is disclosed. The wafer process chamber includes: a support, a plurality of temperature control elements and a processor. The support is configured to support a wafer when the wafer is placed on the support and processed. The plurality of temperature control elements is coupled to the support. Each of the temperature control elements corresponds to a different portion of a wafer respectively such that the temperature control elements correspond to different portions of the wafer. Each of the temperature control elements is configured to individually control temperature of a corresponding portion of the wafer. The processor determines at least one portion of the wafer for temperature uniformity control, and instruct at least one of the temperature control elements, corresponding to the at least one portion, to adjust temperature of the at least one portion for controlling temperature uniformity of the wafer.

In yet another embodiment, a method for controlling wafer uniformity is disclosed. The method includes: corresponding each of a plurality of temperature control elements to a different portion of a wafer respectively; configuring each of the temperature control elements to individually control temperature of a corresponding portion of the wafer; determining at least one portion of the wafer for temperature uniformity control of the wafer; selecting at least one temperature control element, among the plurality of temperature control elements, corresponding to the at least one portion; and adjusting temperature of the at least one portion for controlling temperature uniformity of the wafer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for controlling wafer uniformity, comprising:
   a plurality of temperature control elements, wherein
      each of the temperature control elements corresponds to a different portion of a wafer respectively such that the temperature control elements correspond to different portions of the wafer,
      each of the temperature control elements is configured to individually control temperature of a corresponding portion of the wafer,
      at least one of the temperature control elements is configured to adjust, based on an instruction from a processor, temperature of at least one portion of the wafer for controlling temperature uniformity of the wafer,
      the at least one of the temperature control elements corresponds to the at least one portion of the wafer, and
      each of the temperature control elements comprises:
         a heating element configured to increase temperature of the corresponding portion of the wafer,
         a cooling element configured to decrease temperature of the corresponding portion of the wafer, and
         a sensing element configured to detect temperature of the corresponding portion of the wafer, wherein each of the temperature control elements is an electromagnetic coil configured to individually control temperature of the corresponding portion of the wafer.

2. The apparatus of claim 1, wherein the different portions corresponding to the temperature control elements have a same size.

3. The apparatus of claim 1, wherein the different portions corresponding to the temperature control elements are evenly distributed on the wafer.

4. The apparatus of claim 1, wherein at least one of the different portions corresponding to the temperature control elements has a shape different from an annulus.

5. The apparatus of claim 1, wherein
   a group of temperature control elements, among the plurality of temperature control elements, corresponds to a group of portions of the wafer and is configured to adjust temperature of the group of portions together for controlling temperature uniformity of the wafer.

6. The apparatus of claim 1, further comprising a platform holding the plurality of temperature control elements, wherein the platform is above the wafer during the temperature uniformity control.

7. The apparatus of claim 1, further comprising a platform holding the plurality of temperature control elements, wherein the platform is under the wafer during the temperature uniformity control.

8. The apparatus of claim 1, wherein the at least one portion of the wafer is determined based on a critical dimension (CD) map of the wafer, wherein the CD map represents CD performance of the wafer in at least one of the following plasma enhanced processes: etching, deposition, and polishing.

9. The apparatus of claim 8, wherein the temperature of the at least one portion is adjusted to minimize a non-uniformity in the CD map of the wafer.

10. The apparatus of claim 9, wherein the non-uniformity in the CD map is minimized by minimizing at least one of: a plasma density variation among the different portions of the wafer, a chemical reaction rate variation among the different portions of the wafer, and a CD performance difference between center and edge of the wafer.

11. A wafer process chamber comprising:
    a support configured to support a wafer when the wafer is placed on the support and processed;
    a plurality of temperature control elements coupled to the support, wherein
       each of the temperature control elements corresponds to a different portion of the wafer respectively such that the temperature control elements correspond to different portions of the wafer,
       each of the temperature control elements is configured to individually control temperature of a corresponding portion of the wafer,
       at least one of the temperature control elements is configured to adjust, based on an instruction from a processor, temperature of at least one portion of the wafer for controlling temperature uniformity of the wafer,
       the at least one of the temperature control elements corresponds to the at least one portion of the wafer, and
       each of the temperature control elements comprises:
          a heating element configured to increase temperature of the corresponding portion of the wafer,
          a cooling element configured to decrease temperature of the corresponding portion of the wafer, and
          a sensing element configured to detect temperature of the corresponding portion of the wafer, wherein each of the temperature control elements is an electromagnetic coil configured to individually control temperature of the corresponding portion of the wafer.

12. The wafer process chamber of claim 11, wherein the different portions corresponding to the temperature control elements have a same size.

13. The wafer process chamber of claim 11, wherein the different portions corresponding to the temperature control elements are evenly distributed on the wafer.

14. The wafer process chamber of claim 11, wherein at least one of the different portions corresponding to the temperature control elements has a shape different from an annulus.

15. The wafer process chamber of claim 11, wherein:

the at least one portion of the wafer is determined based on a critical dimension (CD) map of the wafer;

the CD map represents CD performance of the wafer in at least one of the following plasma enhanced processes: etching, deposition, and polishing; and the temperature of the at least one portion is adjusted to minimize a non-uniformity in the CD map of the wafer.

16. The wafer process chamber of claim 11, wherein the plurality of temperature control elements is above the wafer during the temperature uniformity control.

17. The wafer process chamber of claim 11, wherein the plurality of temperature control elements is under the wafer during the temperature uniformity control.

18. A method for controlling wafer uniformity, comprising:

corresponding each of a plurality of temperature control elements to a different portion of a wafer respectively;

configuring each of the temperature control elements to individually control temperature of a corresponding portion of the wafer, wherein each of the temperature control elements is an electromagnetic coil configured to individually control temperature of the corresponding portion of the wafer;

detecting temperature of each portion of the wafer;

determining, based on the detecting, at least one portion of the wafer for temperature uniformity control of the wafer;

selecting at least one temperature control element, among the plurality of temperature control elements, corresponding to the at least one portion; and adjusting, during an inline plasma enhanced process of the wafer, temperature of the at least one portion for controlling temperature uniformity of the wafer.

* * * * *